United States Patent [19]
Pettersson

[11] 3,944,858
[45] Mar. 16, 1976

[54] ARRANGEMENT FOR GENERATING PULSE SEQUENCES

[75] Inventor: Georg Gustaf Lennart Pettersson, Jarfalla, Sweden

[73] Assignee: Telefonaktiebolaget L M Ericsson, Stockholm, Sweden

[22] Filed: Nov. 11, 1974

[21] Appl. No.: 522,623

[30] Foreign Application Priority Data
Nov. 22, 1973 Sweden .............................. 7315809

[52] U.S. Cl. ......... 307/269; 178/69.5 R; 179/15 BS; 307/208; 328/63; 328/72
[51] Int. Cl.² ...................... H03K 1/17; H03K 5/13
[58] Field of Search ........ 307/269, 208; 328/63, 72, 328/199, 201; 178/69.5 R; 179/15 BS

[56] References Cited
UNITED STATES PATENTS

| | | | |
|---|---|---|---|
| 3,566,280 | 2/1971 | Emmons et al. ....................... | 328/63 |
| 3,582,795 | 6/1971 | Heick ................................... | 307/269 |
| 3,671,873 | 6/1972 | Haas et al. ........................... | 307/269 |
| 3,772,600 | 11/1973 | Natali ................................. | 307/269 |

Primary Examiner—Saxfield Chatmon, Jr.
Attorney, Agent, or Firm—Hane, Baxley & Spiecens

[57] ABSTRACT

A pulse code generator generates a number of different pulse sequences within a given frame by comparing the state of a clock driven counter having the same length as the frame and the contents of a fixed memory which contains in sequential locations numbers corresponding to the time position of the pulses within the frame. The memory is addressed by a second counter, which is presettable and is driven by the output pulses from a comparator. By presetting the second counter the position of the first pulse in any sequence is generated.

2 Claims, 1 Drawing Figure

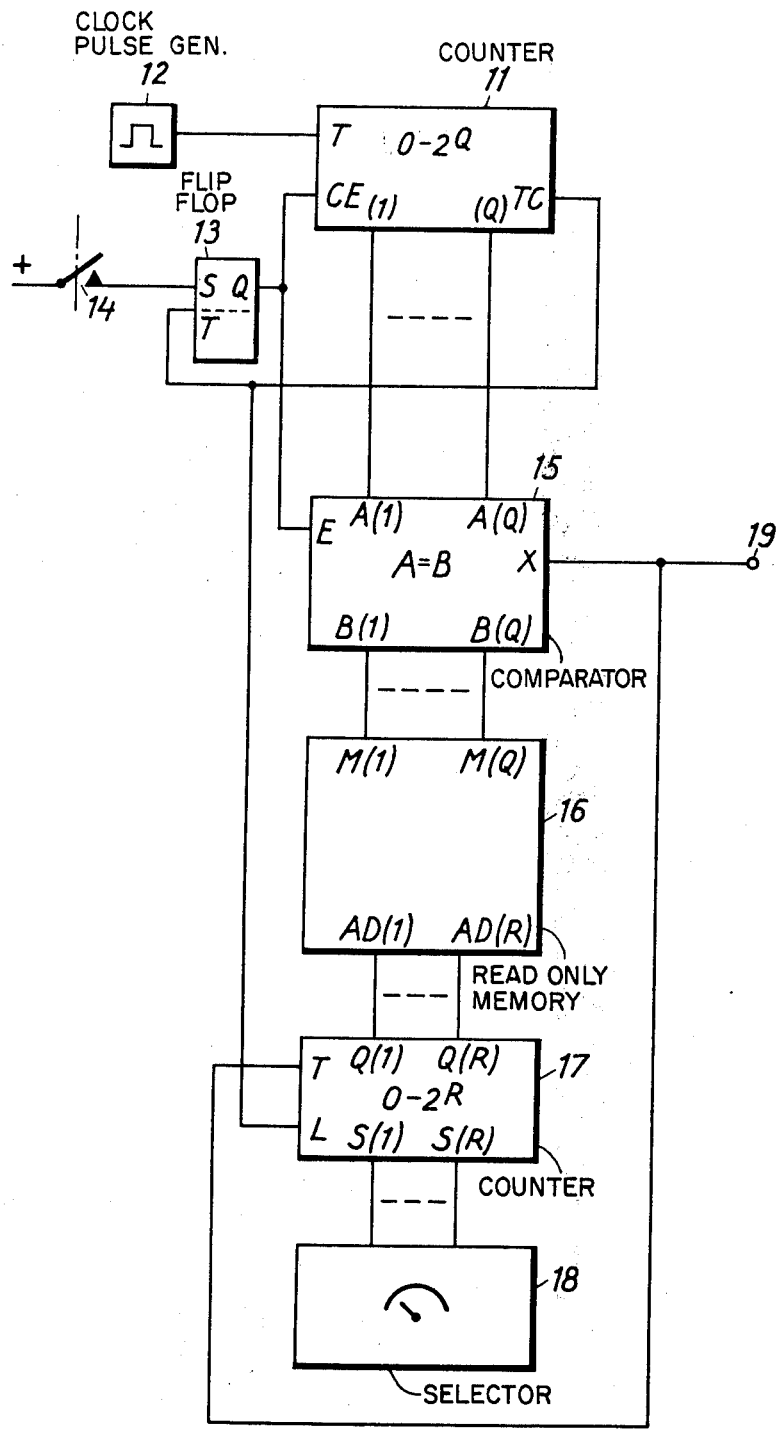

ARRANGEMENT FOR GENERATING PULSE SEQUENCES

The invention relates to an arrangement for generating pulse sequences having M pulses distributed within the frame of a cycle defined by P clock pulses.

It is known to generate a number of different pulse sequences by using integrated fixed memories such as ROM (read only) memories. If it is assumed that the pulse cycle has P pulse positions and that the number of possible pulse sequences are N, a ROM memory is utilized with the capacity N × P × 1 bits where (1) means that the memory has one output. A counter with the capacity P may in turn address P inputs to the ROM memory while the desired code combination by addressing one of N inputs in accordance with the selected combination which address remains during the whole counter cycle. One drawback with this arrangement is that the ROM memory becomes very large especially for long pulse cycles. On the contrary the number of pulses within the cycle does not matter. For relatively few pulses in the code, the ROM memory is therefore utilized badly. Another drawback is that the pulses cannot be obtained until the read-out time of the ROM memory has passed. As each counter pulse gives a new address to the ROM memory one must wait until after this read-out time before a new counter pulse is given. The ROM memory, especially such with large capacity, is usually manufactured in MOS technology whereby the reading time is of the magnitude one microsecond which cannot be accepted in many applications.

According to the invention it is possible to use ROM memories with considerably smaller capacity for generating pulse codes with relatively few pulse elements. Thus the ROM memory may be manufactured in the faster bipolary technology. The information from the ROM memory is, furthermore, accessible already when a counter pulse appears and because of that one need not to wait for the reading time. The apparatus according to the invention has the characteristics which appear from the appended claims and will be described in connection to the accompanying drawing whose sole FIGURE a block diagram.

In the FIGURE reference 11 is a counter which is driven by a clock pulse generator 12. The counter 11 is started when a start condition is put on its input CE. The start condition is obtained from the output Q at the flip-flop circuit 13 when this is set by closure of the contact 14. The counter 11 has an output TC which generates a signal when the end value of the counter is reached. This output is connected to a trigger input T of the flip-flop circuit 13. The counter 11, which is assumed to be a binary counter, has its counter stages 1, 2, ... Q (where $P = 2^Q$) connected to a first set of data inputs A1, A2, ... AQ of a comparator 15. The second set of data inputs B1, B2, ... BQ of the comparator 15 are connected to the data outputs M1, M2, ... MQ of a read-only memory (ROM) 16 which has address inputs AD1, AD2, ... ADR. These address inputs are connected to the outputs Q1, Q2, ... QR of a counter 17 with the capacity $$\sum_{i=1}^{N} M(i)$$

where N is the number of different codes which can be chosen, M is the number of elements in each code, whereby code number i (where i=1, 2 ... N) has M(i) elements and $$\sum_{i=1}^{N} M(i) = 2^R.$$

The counter 17 is a presettable binary counter with the preset inputs S1, S2, ... SR to the different counter stages. The preset inputs are connected to a selector 18, each position of which emits a certain binary combination which constitutes the start value of the counter 17. The preset is under control of the signal TC from the counter 11, i.e. a new start value is entered into the counter 17 each time the counter 11 has completed a count cycle. The coincidence signals from the output X of the comparator 15 are fed into the input T of the counter 17 so that the counter is stepped forward one step each time coincidence is established. The output X of the comparator 15 is also connected to the output 19 of the pulse sequence generator.

The operation of the arrangement will be described in connection to the table below which shows the data content in the counters 11 and 17 and the memory 16 at two different settings of the selector 18.

| Selector 18 position | emitted code | Address counter 17 position | Memory 16 content | Clock pulse No. to counter 11 at coincidence | Outgoing pulse No. |
|---|---|---|---|---|---|
| 1 | 00000 | 00000 | 0000000 | 1 | 1 |
| M(i)=3 | | 00001 | 0001111 | 16 | 2 |
| | | 00010 | 1000000 | 65 | 3 |
| 2 | 00011 | 00011 | 0000000 | 1 | 1 |
| M(i)=3 | | 00100 | 0100000 | 33 | 2 |
| | | 00101 | 1111110 | 127 | 3 |
| 3 | 00110 | 00110 | 0000000 | 1 | 1 |
| M(i)=4 | | 00111 | 0010011 | 20 | 2 |
| | | 01000 | 1001001 | 74 | 3 |
| | | 01001 | 1010101 | 85 | 4 |

At the position No. 1 of the selector 18 the code 00000 is applied to the preset inputs S1 - SR of the counter 17. As soon as the input L receives preset load signal when the counter 11 has completed a cycle, the counter is preset to this combination as a start value. This value is also appears at the outputs Q1 - QR of the counter 17 and the address inputs AD1 - ADR of the memory 16. The address input signal selects a cell in the memory with the address 00000 which according to the table has the data content 0000000. After the read delay time of the memory this data word is directly accessible at the inputs B1 - BS in the comparator 15.

When a pulse generation cycle is started by closure of the contact 14 the following happens. The flip-flop 13 is set, the comparator being made active and the input T of the counter 11 being opened for the pulses from the clock pulse source 12. The first clock pulse which is generated puts the counter 11 in its output position 0000000 which combination is fed into the inputs A1 - AS of the comparator 15. As this combination also appears at the inputs B1 - BS, coincidence is indicated and the first pulse in the pulse code appears at the output 19. The coincidence pulse also steps the counter 17 forward one step and the new address 00001 is given to the memory 16. In the memory cell with this address there is the bit combination 0001111. The counter 11 continues to count the clock pulses and after the 16th clock pulse coincidence is again obtained and the counter 17 is stepped forward to 00010, which is the address to the memory cell with the contents 1000000. The counter 11 reaches this value during the 65th clock pulse when coincidence is obtained again. The counter 17 is again stepped forward one step, but as the code including three pulses now is completed this position of the counter 17 must address a cell in the memory which holds a number which is less than the actual count of the counter 11. In the shown example the address counter position 00011 is in fact the start value for the next code selector position No. 2 and a cell with the content 0000000 is accessed. The counter 11 continues to count forward to its end value 1111111 where the output TC obtains a signal which resets the flip-flop 13 blocking the supply of further clock pulses. Simultaneously the counter 17 is again preset in dependence on the position of the selector 18. The arrangement is thereafter at rest until a new start pulse is given by closing the contact 14 and a further code sequence is generated.

We claim:

1. Apparatus for generating coded combinations of code pulses wherein each coded combination has P possible code pulse positions but only M(i) code pulse positions being occupied by coded pulses while P-M(i) code pulse positions are unoccupied; said apparatus comprising: a clock pulse source; a first pulse counter for counting the clock pulses from said clock pulse source, said first pulse counter including indicating means for giving an indication upon counting P clock pulses; a read-only-memory having $$\sum_{i=1}^{N} M(i)$$

addressable cells subdivided into N sets of cells having consecutive addresses, wherein each set of cells is assigned to one of the coded combinations of code pulses and each cell of the set stores a number related to the position in the coded combination occupied by one of the M(i) pulses; a second pulse counter for counting identity pulses, said second pulse counter including output means for transmitting cell addresses to said read-only-memory in accordance with the instantaneous pulse counts accumulated therein; presetting means for selectively presetting said second pulse counter to store different initial counts; comparator means for comparing a first instantaneous count accumulated in said first pulse counter with the number stored in the addressed cell of said read-only-memory as represented by a second instantaneous count accumulated in said second pulse counter, said comparator means including means for transmitting an identity pulse to said second pulse counter each time a predetermined relationship exists between said first instantaneous count and said number; and a code pulse output means for emitting a code pulse each time an identity pulse is transmitted by said comparator means.

2. The apparatus of claim 1 further comprising means responsive to said indicating means for inhibiting the counting of clock pulses by said first pulse counter and for activating said presetting means.

* * * * *